(12) United States Patent
Tsukamoto et al.

(10) Patent No.: US 7,397,023 B2
(45) Date of Patent: *Jul. 8, 2008

(54) IMAGE SENSOR MODULE WITH OPTICAL PATH DELIMITER AND ACCURATE ALIGNMENT

(75) Inventors: Hiroaki Tsukamoto, Yamatotakada (JP); Nobuhito Hirosumi, Fukuyama (JP); Takashi Yasudome, Fukuyama (JP); Kazuo Kinoshita, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/388,531

(22) Filed: Mar. 23, 2006

(65) Prior Publication Data
US 2006/0219884 A1 Oct. 5, 2006

(30) Foreign Application Priority Data
Mar. 29, 2005 (JP) ............... 2005-095571

(51) Int. Cl.
H01L 27/00 (2006.01)
H01L 27/14 (2006.01)
H01L 23/12 (2006.01)

(52) U.S. Cl. ............... 250/239; 250/208.1; 250/214 R; 250/214.1; 257/431; 257/432; 257/433; 257/678; 257/787; 396/429; 396/529; 396/535

(58) Field of Classification Search ............ 250/208.1, 250/214.1, 214 R, 239; 257/431–434, 678, 257/680, 787; 396/529–533, 535, 429, 544; 348/335, 340, 360, 373–376

See application file for complete search history.

(56) References Cited

U.S. PATENT DOCUMENTS

| 6,791,076 | B2 | 9/2004 | Webster |
| 7,009,654 | B2 * | 3/2006 | Kuno et al. ............... 348/374 |
| 7,019,374 | B2 * | 3/2006 | Kayanuma et al. ......... 257/432 |
| 2002/0154239 | A1 * | 10/2002 | Fujimoto et al. .......... 348/340 |
| 2003/0048378 | A1 * | 3/2003 | Kim et al. ................. 348/375 |
| 2004/0095502 | A1 * | 5/2004 | Losehand et al. .......... 348/340 |

(Continued)

FOREIGN PATENT DOCUMENTS

EP    1 462 839 A1    9/2004

(Continued)

*Primary Examiner*—Davienne Monbleau
(74) *Attorney, Agent, or Firm*—Edwards Angell Palmer & Dodge LLP; David G. Conlin; Peter J. Manus

(57) ABSTRACT

An optical path delimiter having a lens is disposed so as to be in contact with a transparent lid bonded to a surface of a solid-state image sensor, and is fixed without bonded. Further, the solid-state image sensor to which the transparent lid is bonded, the optical path delimiter disposed so as to be in contact with the transparent lid without bonded, a DSP serving as a signal processor, a circuit part and a wiring board are fixed by being sealed in a synthetic resin. Even when distortion occurs due to warpage, flexure or the like on a board where the solid-state image sensor is disposed, the accuracy of the alignment of the lens with respect to the solid-state image sensor never decreases. In addition, the solid-state image sensor or the signal processor is never damaged by an external shock.

8 Claims, 7 Drawing Sheets

U.S. PATENT DOCUMENTS

| | | |
|---|---|---|
| 2004/0149885 A1 | 8/2004 | Shiau |
| 2004/0164981 A1 | 8/2004 | Fujita et al. |
| 2004/0189854 A1 | 9/2004 | Tsukamoto et al. |
| 2005/0012032 A1* | 1/2005 | Onodera et al. .......... 250/214.1 |
| 2005/0062083 A1 | 3/2005 | You et al. |
| 2005/0073036 A1* | 4/2005 | Appelt et al. ................ 257/678 |
| 2005/0179805 A1* | 8/2005 | Avron et al. ................ 348/340 |
| 2005/0212947 A1* | 9/2005 | Sato et al. ................... 348/340 |
| 2005/0237418 A1 | 10/2005 | Sakamoto |
| 2006/0012018 A1* | 1/2006 | Karnezos et al. ............ 257/678 |
| 2006/0164539 A1* | 7/2006 | Van Arendonk et al. ..... 348/340 |

FOREIGN PATENT DOCUMENTS

| | | |
|---|---|---|
| JP | 2000-125212 | 4/2000 |
| JP | 2004-040287 | 2/2004 |
| JP | 2004-296453 | 10/2004 |
| JP | 2004-301938 | 10/2004 |

* cited by examiner

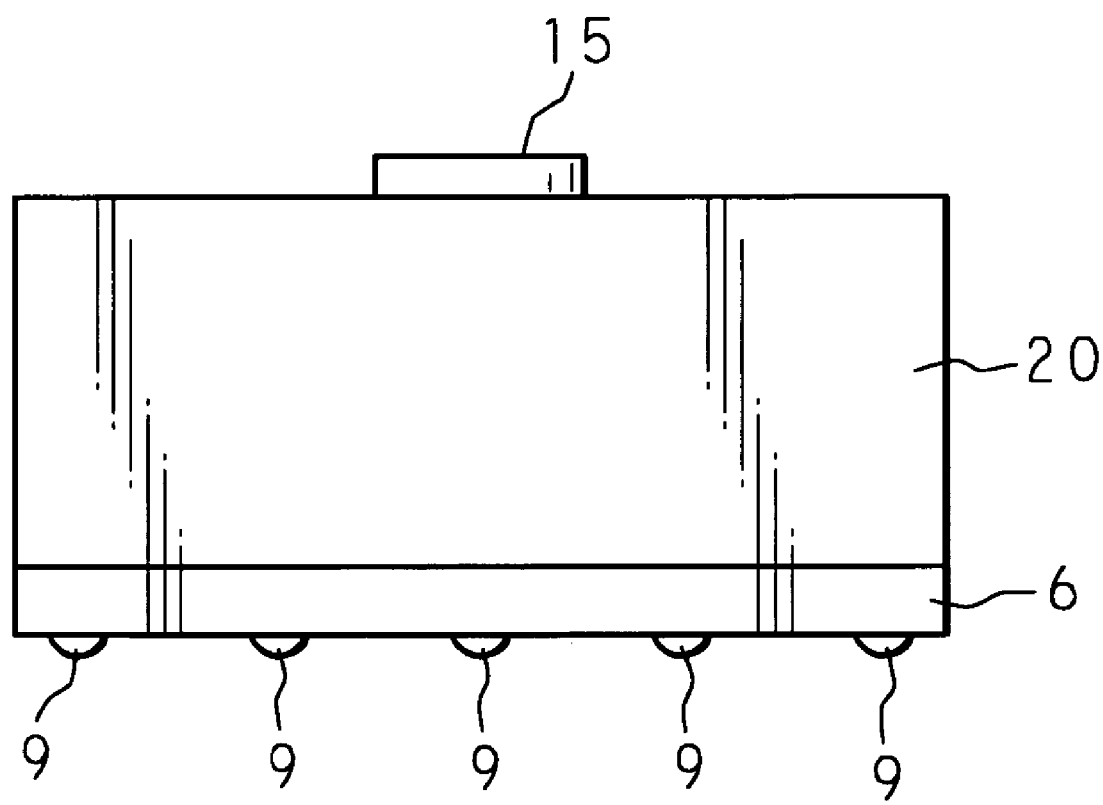
F I G. 3

F I G. 6C
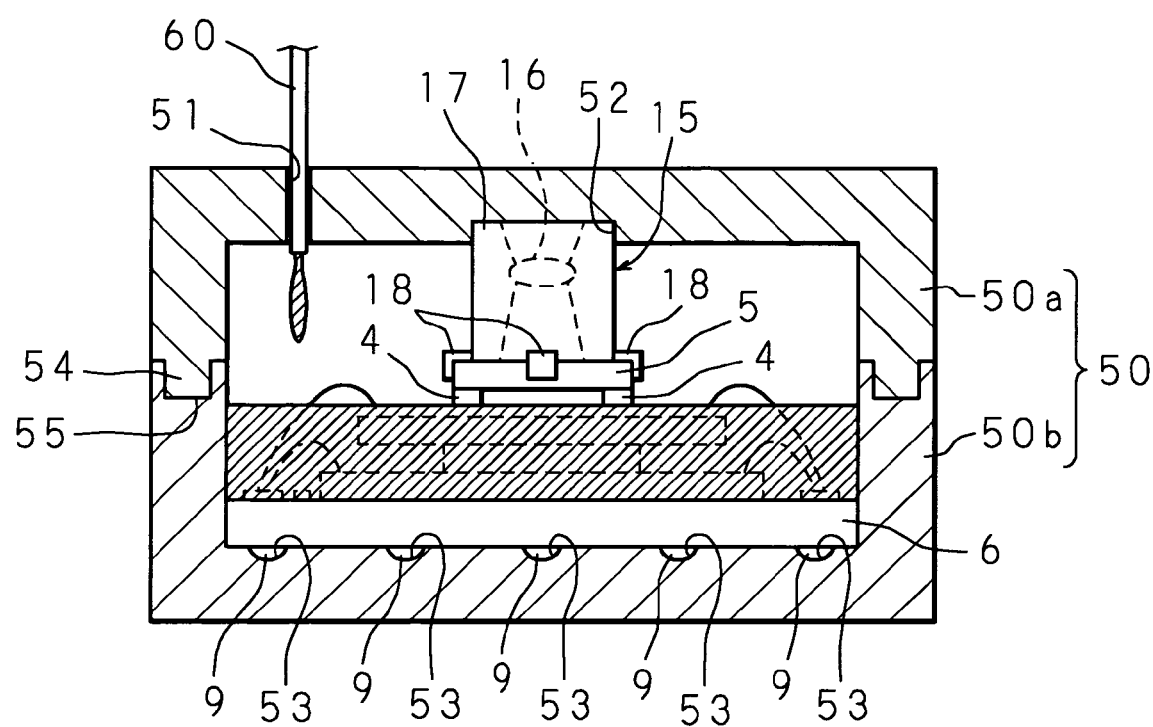

IMAGE SENSOR MODULE WITH OPTICAL PATH DELIMITER AND ACCURATE ALIGNMENT

CROSS-REFERENCE TO RELATED APPLICATIONS

This Nonprovisional application claims priority under 35 U.S.C §119(a) on Patent Application No. 2005-95571 filed in Japan on Mar. 29, 2005, the entire contents of which are hereby incorporated by reference.

BACKGROUND OF THE INVENTION

The present invention relates to an optical device module incorporated in digital cameras, camera phones and the like and having a solid-state image sensor for photographing a subject, and a method of fabricating the optical device module.

A solid-state image sensor provided in digital cameras, digital video cameras, camera phones and the like is for capturing the subject to be photographed. The solid-state image sensor is integrated into a module together with a lens, an infrared intercepting material and a signal processor processing the electric signal converted from captured image by the image sensor, and is provided as an optical device module. In recent years, digital cameras, camera phones and the like incorporating the optical device module have been reduced in size, and the optical device module has also been reduced in size.

In the optical device module, it is necessary that the optical center of the image sensing area of the solid-state image sensor coincide with the optical center of the lens, and it is also necessary that the plane formed by the image sensing surface be orthogonal to the optical axis of the lens. When the accuracy of the alignment of the lens' axis with the sensor's center is low, a problem occurs such that focus cannot be achieved or that the image captured by the solid-state image sensor is dark. For this reason, an adjustment mechanism for adjusting focus is provided, and focus adjustment is performed after the optical device module is fabricated. However, the provision of the adjustment mechanism hinders the size reduction of the optical device module.

Japanese Patent Application Laid-Open No. 2000-125212 proposes an imaging module in which a semiconductor chip where a solid-state image sensor is formed is bonded onto a ceramic board, a frame material holding an infrared intercepting material is bonded onto the ceramic board so as to cover the semiconductor chip and a lens frame material holding a lens is bonded onto the ceramic board so as to cover the frame material. By bonding the semiconductor chip, the frame material and the lens frame material onto the same plane of the ceramic board, their alignment accuracy is improved.

Japanese Patent Application Laid-Open No. 2004-40287 proposes an image sensor module in which an image sensor chip is bonded onto a board, a housing holding a lens and an optical filter is bonded onto the board so as to cover the image sensor and the lens is pressed into the housing by a lens retainer that becomes elastically deformed. By fixing the lens in the housing by the lens retainer, the distance between the lens and the image sensor can be accurately defined.

Japanese Patent Application Laid-Open No. 2004-301938 proposes an optical device module in which a signal processor that processes signals outputted from a solid-state image sensor is bonded to a wiring board, the solid-state image sensor is bonded onto the signal processor, a transparent lid is bonded to a surface of the solid-state image sensor and a lens holder holding a lens is bonded to the transparent lid. Since the lens holder is bonded to the transparent lid bonded to the surface of the solid-state image sensor, the accuracy of the alignment of the lens with respect to the solid-state image sensor can be improved.

BRIEF SUMMARY OF THE INVENTION

However, according to the imaging module described in Japanese Patent Application Laid-Open No. 2000-125212, since the lens frame material holding the lens is bonded onto the ceramic board and the ceramic board is large in manufacturing nonuniformity, when distortion occurs due to warpage, flexure or the like on the plane of the ceramic board serving as the reference plane, the accuracy of the alignment of the lens with respect to the solid-state image sensor is decreased. Likewise, according to the image sensor module described in Japanese Patent Application Laid-Open No. 2004-40287, since the housing holding the lens is bonded onto the board, when distortion occurs on the board, the alignment accuracy of the lens is decreased.

According to the optical device module described in Japanese Patent Application Laid-Open No. 2004-301938, since the lens holder is bonded to the transparent lid bonded onto the solid-state image sensor and the solid-state image sensor and the transparent lid are bonded together by a sheet-form bonding agent, the transparent lid can be bonded to the solid-state image sensor with high accuracy, and the accuracy of the alignment of the lens with respect to the solid-state image sensor is high. However, since the signal processor, the solid-state image sensor and the transparent lid are placed one on another on the board and the lens holder is further bonded to the transparent lid, there is a possibility that the solid-state image sensor, the signal processor and the like are damaged due to a shock given to the lens holder.

Moreover, according to the conventional structures, the lens holder holding the lens is bonded to the transparent lid or the board by a bonding agent. When the bonding agent is applied, it is difficult to make the thickness of the bonding agent uniform, there is a possibility that an error occurs in the lens position because of an error of the thickness of the bonding agent, and there is a possibility that excess bonding agent extends to the optical path and is captured in the image.

The present invention is made in view of the above-mentioned circumstances, and an object thereof is to provide an optical device module in which an optical path delimiter having a lens is disposed so as to be in contact with a transparent lid bonded to a surface of a solid-state image sensor and the relative positions of the optical path delimiter and the solid-state image sensor are fixed to thereby improve the accuracy of the alignment of the lens with respect to the solid-state image sensor.

Another object of the present invention is to provide an optical device module in which by fixing the parts, of the optical path delimiter and the transparent lid, that are in contact with each other without bonding them, there is neither a possibility that an error occurs in the lens position because of an error of the thickness of the bonding agent nor a possibility that excess bonding agent extends to the optical path and is captured in the image.

Another object of the present invention is to provide an optical device module in which by fixing the solid-state image sensor to which the transparent lid is bonded and the optical path delimiter disposed so as to be in contact with the transparent lid without bonded, by sealing them in a resin, fabrication is easy and there is no possibility that the solid-state image sensor is damaged by a shock.

Another object of the present invention is to provide an optical device module that can be more easily fabricated and is more tolerant of shocks by fixing a wiring board, a signal processor and a circuit part by sealing them in the resin together with the solid-state image sensor, the transparent lid and the optical path delimiter.

Another object of the present invention is to provide an optical device module in which by providing the optical path delimiter with a positioning portion that uniquely determines the positions of the optical path delimiter and the transparent lid, the alignment of the optical path delimiter and the transparent lid in the fabrication process can be easily performed.

Another object of the present invention is to provide an optical device module in which the alignment of the optical path delimiter and the transparent lid in the fabrication process can be easily performed since the positions of the optical path delimiter and the transparent lid are uniquely determined by providing the positioning portion with a claw that engages with at least two parts of a side surface of the transparent lid when the optical path delimiter is made in contact with a surface of the plate-form transparent lid.

Another object of the present invention is to provide a method of fabricating an optical device module that is capable of accurately performing the alignment of the lens with respect to the solid-state image sensor by having a disposition process to dispose the optical path delimiter so as not to be bonded but to be in contact with the transparent lid bonded to the solid-state image sensor, is capable of easily fixing the solid-state image sensor, the transparent lid and the optical path delimiter by having a sealing process to seal them in a resin, and is capable of fabricating an optical device module tolerant of shocks.

Another object of the present invention is to provide a method of fabricating an optical device module that is capable of more facilitating the fabrication process and is capable of fabricating an optical device module in which there is no possibility that the signal processor is damaged by a shock, by sealing the wiring board and the signal processor in the resin together with the solid-state image sensor, the transparent lid and the optical path delimiter in the sealing process.

In an optical device module according to the present invention provided with: a solid-state image sensor having an image sensing surface; a transparent lid disposed so as to be opposed to the image sensing surface; a bonding portion that bonds the transparent lid to the solid-state image sensor; and an optical path delimiter that delimits the optical path to the image sensing surface, the relative positions of the optical path delimiter and the solid-state image sensor are fixed by making the optical path delimiter in contact with the transparent lid, and fixing means is provided for fixing the relative positions of the optical path delimiter and the transparent lid.

According to the present invention, the optical path delimiter having a lens is disposed so as to be in contact with the transparent lid bonded to a surface of the solid-state image sensor to thereby determine the relative positions of the optical path delimiter and the solid-state image sensor. Since the transparent lid can be bonded to the solid-state image sensor with high accuracy even when distortion occurs due to warpage, flexure or the like on the board where the solid-state image sensor is disposed, the accuracy of the alignment of the lens with respect to the solid-state image sensor is improved. Consequently, a mechanism that performs focus adjustment after fabrication is unnecessary, so that the size of the optical device module can be reduced.

Moreover, in an optical device module according to the present invention, parts, of the optical path delimiter and the transparent lid, that are in contact with each other are not bonded together.

According to the present invention, the parts, of the optical path delimiter and the transparent lid, that are in contact with each other are fixed without bonded. Consequently, no error occurs in the lens position because of an error of the thickness of the bonding agent, and the accuracy of the alignment of the lens with respect to the solid-state image sensor is not decreased. In addition, there is no possibility that excess bonding agent extends to the optical path and is captured in the image.

Moreover, in an optical device module according to the present invention, the fixing means fixes the solid-state image sensor, the transparent lid and the optical path delimiter by sealing them in a resin.

According to the present invention, the solid-state image sensor to which the transparent lid is bonded and the optical path delimiter disposed so as to be in contact with the transparent lid without bonded are fixed by being sealed in a resin. Consequently, the optical device module can be easily fabricated, so that the manufacturing cost can be reduced. In addition, since the solid-state image sensor, the transparent lid and the optical path delimiter can be firmly fixed and this enhances the structural strength of the optical device module, the solid-state image sensor can be prevented from being damaged by a shock.

Moreover, an optical device module according to the present invention is provided with: a wiring board where a conductor wiring is formed; and a signal processor and a circuit part fixed to the wiring board and electrically connected to the conductor wiring, and the fixing means fixes the wiring board, the signal processor and the circuit part by sealing them in the resin together with the solid-state image sensor, the transparent lid and the optical path delimiter.

According to the present invention, the wiring board, the signal processor and the circuit part are fixed by being sealed in the resin together with the solid-state image sensor, the transparent lid and the optical path delimiter. Consequently, the optical device module can be easily fabricated, so that the manufacturing cost can be reduced. In addition, since the wiring board, the signal processor, the circuit board, the solid-state image sensor, the transparent lid and the optical path delimiter can be firmly fixed, the solid-state image sensor, the signal processor and the like can be prevented from being damaged by a shock.

Moreover, in an optical device module according to the present invention, the optical path delimiter has a positioning portion that determines the relative positions of the optical path delimiter and the transparent lid.

According to the present invention, the optical path delimiter is provided with the positioning portion that determines the positions of the optical path delimiter and the transparent lid so that the positions can be uniquely determined by making the optical path delimiter in contact with the transparent lid when the optical device module is fabricated. Consequently, the alignment of the optical path delimiter and the transparent lid in the fabrication process can be easily performed, so that the fabrication process can be simplified.

Moreover, in an optical device module according to the present invention, the transparent lid has a plate form, and the positioning portion has a claw that engages with at least two parts of a side surface of the transparent lid when the optical path delimiter is made in contact with one surface of the transparent lid.

According to the present invention, when the optical path delimiter is made in contact with the surface of the plate-form transparent lid, the claw of the positioning portion engages with at least two parts of the side surface of the transparent lid, thereby fixing the relative positions of the optical path delimiter and the transparent lid. Consequently, only by making the optical path delimiter in contact with the transparent lid, the positions of the optical path delimiter and the transparent lid are uniquely determined and this makes it easy to perform the alignment of the optical path delimiter and the transparent lid, so that the fabrication process can be simplified.

Moreover, a method, according to the present invention, of fabricating an optical device module having: a solid-state image sensor having an image sensing surface; a transparent lid disposed so as to be opposed to the image sensing surface; a bonding portion that bonds the transparent lid to the solid-state image sensor; and an optical path delimiter that delimits an optical path to the image sensing surface, is provided with: a disposition process to dispose the optical path delimiter so as to be in contact with the transparent lid bonded to the solid-state image sensor; and a sealing process to seal the solid-state image sensor, the transparent lid and the optical path delimiter in a resin.

According to the present invention, in the disposition process, the optical path delimiter is disposed so as not to be bonded but to be in contact with the transparent lid bonded to a surface of the solid-state image sensor. Consequently, the alignment of the lens with respect to the solid-state image sensor can be performed with high accuracy and this makes it unnecessary to provide a mechanism that performs focus adjustment after fabrication, so that the size of the optical device module can be further reduced. In addition, in the sealing process, the solid-state image sensor, the transparent lid and the optical path delimiter are sealed in a resin. Consequently, these can be firmly fixed with ease and an optical device module tolerant of shocks can be easily fabricated, so that the solid-state image sensor can be prevented from being damaged by a shock.

Moreover, in a method of fabricating an optical device module according to the present invention, in the sealing process, a wiring board where a conductor wiring is formed and a signal processor fixed to the wiring board and electrically connected to the conductor wiring are further sealed in the resin.

According to the present invention, in the sealing process, the wiring board and the signal processor are sealed in a resin together with the solid-state image sensor, the transparent lid and the optical path delimiter. Consequently, the fabrication of the optical device module can be more easily performed and an optical device module more tolerant of shocks can be fabricated, so that the solid-state image sensor, the signal processor and the like can be prevented from being damaged by a shock.

The above and further objects and features of the invention will more fully be apparent from the following detailed description with accompanying drawings.

BRIEF DESCRIPTION OF THE SEVERAL VIEWS OF THE DRAWINGS

FIG. 3 is a side view showing the appearance of the optical device module according to the present invention;

FIGS. 6A to 6C are schematic views showing the fabrication process of the optical device module according to the present invention.

DETAILED DESCRIPTION OF THE INVENTION

Figure 1:
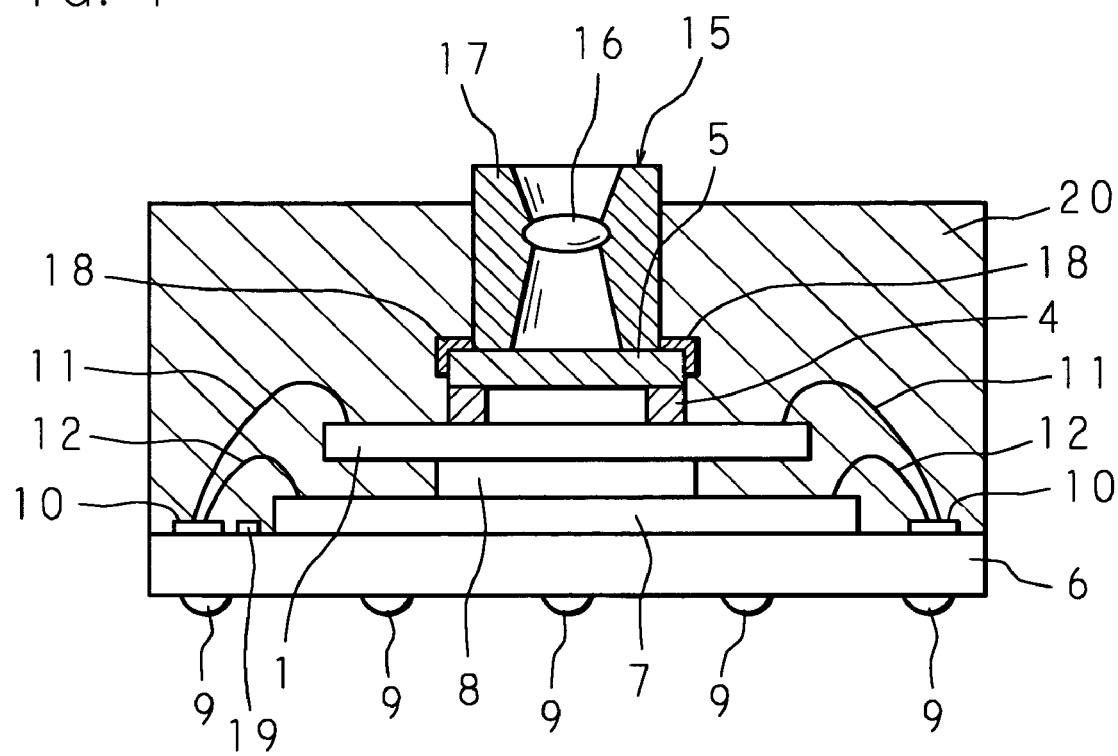
FIG. 1 is a schematic cross-sectional view showing the structure of an optical device module according to the present invention.
Figure 2:
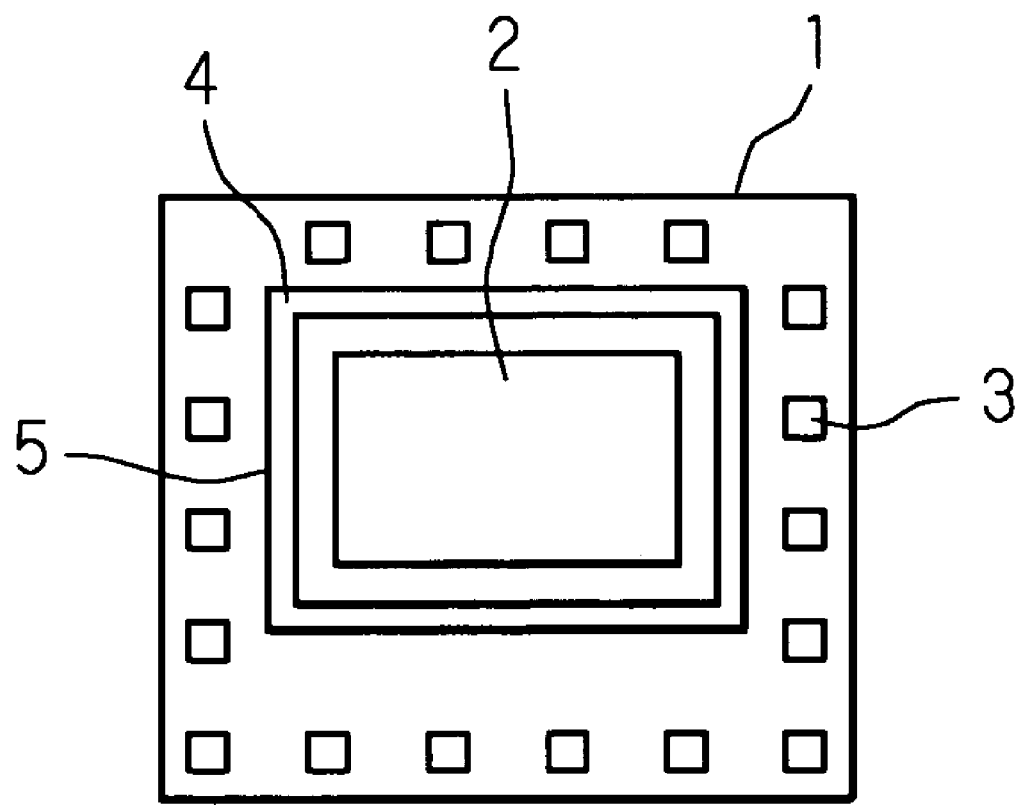
FIG. 2 is a plan view of a solid-state image sensor according to the present invention.
Figure 4:
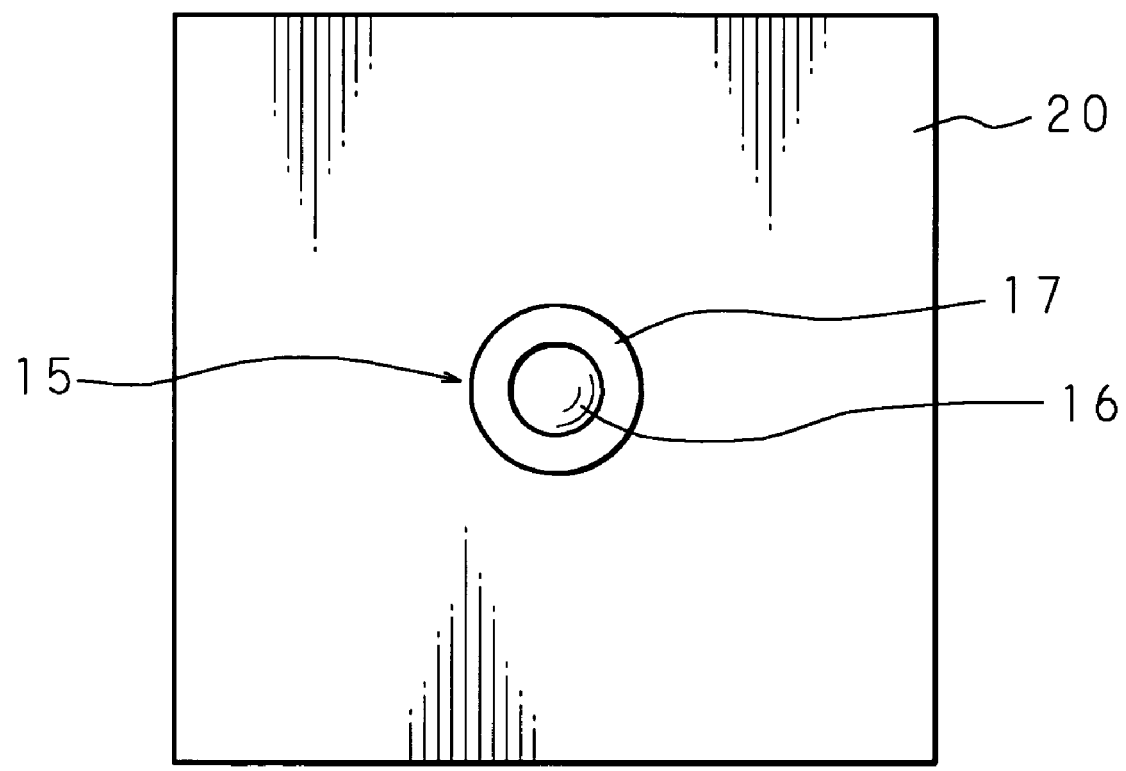
FIG. 4 is a plan view showing the appearance of the optical device module according to the present invention.
Figure 5:
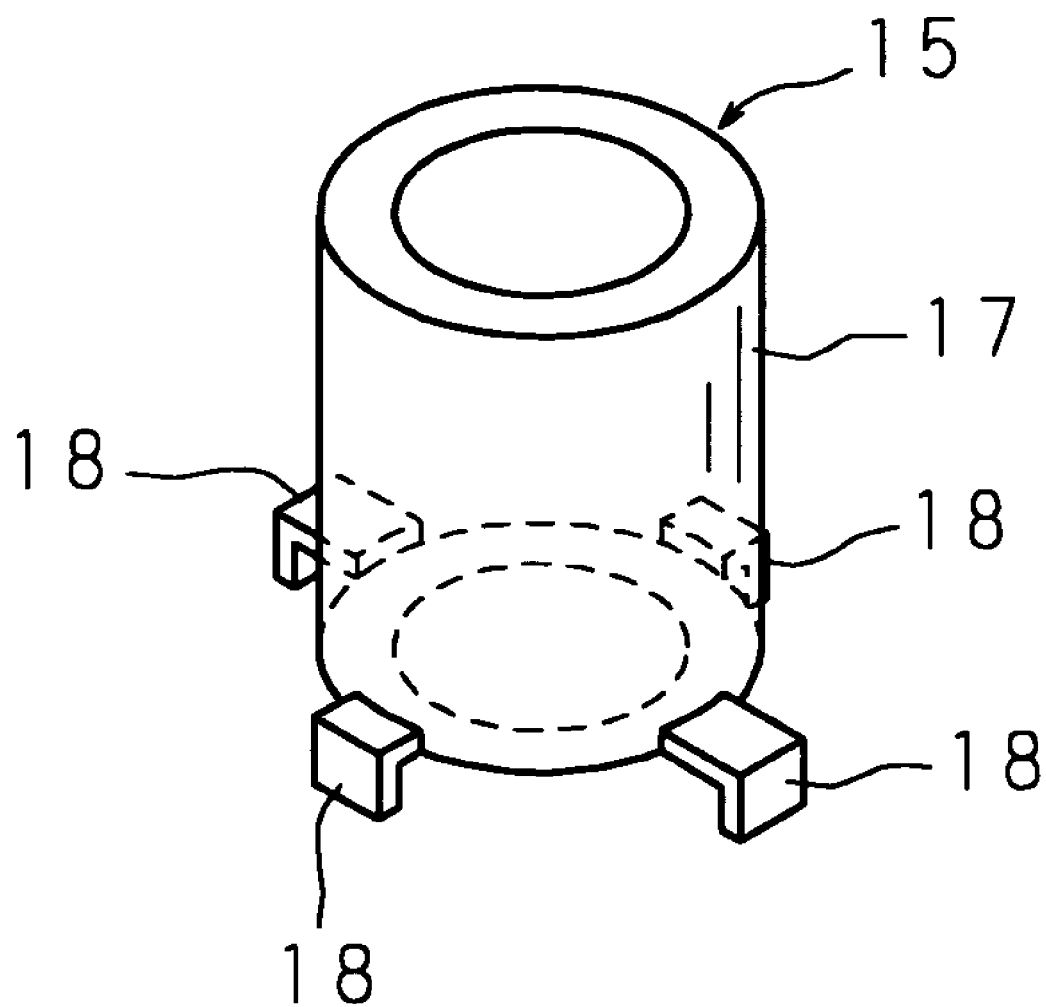
FIG. 5 is a perspective view showing the structure of an optical path delimiter of the optical device module according to the present invention.

Hereinafter, the present invention will be concretely described with reference to the drawings showing an embodiment thereof. FIG. 1 is a schematic cross-sectional view showing the structure of an optical device module according to the present invention. FIG. 2 is a plan view of a solid-state image sensor according to the present invention. FIG. 3 is a side view showing the appearance of the optical device module according to the present invention. FIG. 4 is a plan view showing the appearance of the optical device module according to the present invention. FIG. 5 is a perspective view showing the structure of an optical path delimiter of the optical device module according to the present invention.

The optical device module according to the present invention includes a solid-state image sensor 1 that receives external light, a transparent lid 5 that protects the solid-state image sensor 1, a DSP 7 serving as the signal processor, and an optical path delimiter 15 that directs the external light to the solid-state image sensor 1. These components are placed one on another on a wiring board 6.

The solid-state image sensor 1 is formed by applying a semiconductor process technology to a semiconductor board such as silicon. On the upper surface of the solid-state image sensor 1, the following are formed: an image sensing surface 2 for performing photoelectric conversion; and a plurality of bonding pads 3 serving as connection terminals for connection to external circuits, input and output of electric signals and supply of power. On the upper surface of the solid-state image sensor 1, the transparent lid 5 is bonded by a bonding portion 4 so as to be opposed to the image sensing surface 2. The bonding portion 4 has a substantially rectangular shape surrounding the perimeter of the image sensing surface 2, and bonds the substantially rectangular transparent lid 5 to the solid-state image sensor 1 so that the space between the image sensing surface 2 and the transparent lid 5 is enclosed. By enclosing the space between the image sensing surface 2 and the transparent lid 5, the entry of moisture to the image sensing surface 2 and the entry and adhesion of dust can be prevented, so that the occurrence of malfunctions on the image sensing surface 2 can be prevented.

The transparent lid 5 has a rectangular plate form, and is made of a transparent material such as glass. The solid-state image sensor 1 captures the external incident light having passed through the transparent lid 5, and receives it by a plurality of light receiving elements arranged on the image sensing surface 2.

The bonding portion 4, which has a sheet-form bonding agent attached thereto, is desirably formed by patterning by performing processing such as exposure or development by the photolithography technology. When the photolithography technology is used, the patterning of the bonding portion 4 can be performed with high accuracy. Since a sheet-form bonding agent is used to form the bonding portion 4, the thickness of the bonding portion 4 can be made uniform, so that the transparent lid 5 can be bonded to the image sensing surface 2 with high accuracy.

The solid-state image sensor 1 to which the transparent lid 5 is bonded is placed, together with the DSP 7, on the wiring board 6 where a conductor wiring 10 is formed by patterning. The structure of the lamination is such that the DSP 7 and a circuit part 19 are mounted on the wiring board 6, a spacer 8 as which a rectangular-plate-form silicon piece is used is bonded onto the DSP 7 and the solid-state image sensor 1 is bonded onto the spacer 8. The DSP 7 is a semiconductor chip that controls the operation of the solid-state image sensor 1 and processes the signals outputted from the solid-state image sensor 1. The circuit part 19 is, for example, a capacitor for removing the noise of the power source of the DSP 7, a resistor and a capacitor of a filter circuit, and a voltage conversion transistor, and is provided in a plurality of numbers on the wiring board 6. By disposing the solid-state image sensor 1, the DSP 7 and the circuit parts 19 in the same module, digital cameras, camera phones and the like provided with the optical device module can be reduced in size. A plurality of bonding pads (not shown) for performing input and output of electric signals and the like are formed on a surface of the DSP 7. After the DSP 7 is bonded onto the wiring board 6, the bonding pads of the DSP 7 and the conductor wiring 10 of the wiring board 6 are electrically connected together by bonding wires 12.

The bonding pads 3 of the solid-state image sensor 1 bonded onto the spacer 8 and the conductor wiring 10 on the wiring board 6 are electrically connected together by bonding wires 11. Since the DSP 7 and the solid-state image sensor 1 are electrically connected together through the conductor wiring 10 on the wiring board 6, transmission and reception of electric signals can be performed therebetween. In order that the bonding wires 11 are not in contact with the DSP 7 or the bonding wires 12 connected to the DSP 7, the distance between the solid-state image sensor 1 and the DSP 7 is adjusted by the spacer 8.

The optical path delimiter 15 for directing the external light to the image sensing surface 2 of the solid-state image sensor 1 is disposed on the transparent lid 5 of the solid-state image sensor 1 disposed on the wiring board 6 with the DSP 7 and the spacer 8 in between. The optical path delimiter 15 has a lens 16 and a lens barrel 17 holding the lens 16. The lens barrel 17 has a substantially cylindrical shape, and the lens 16 is fixed to the inner surface of the lens barrel 17 so that the axial center of the lens barrel 17 and the optical axis of the lens 16 coincide with each other. At the four corners of the side surface on one end of the lens barrel 17, positioning claws 18 for determining the relative positions of the lens barrel 17 and the transparent lid 5 with respect to the direction of the plane of the transparent lid 5 are disposed. The positioning claws 18 protrude in the axial direction from the side of the end of the lens barrel 17 to the outside of the end surface of the lens barrel 17 where an opening is formed. When the optical path delimiter 15 is disposed on the transparent lid 5, the four positioning claws 18 abut on the periphery of the transparent lid 5 and the transparent lid 5 is caught by the positioning claws 18, thereby fixing the relative positions of the transparent lid 5 and the optical path delimiter 15. Since the distance between each two opposed positioning claws 18 is substantially the same as the length of the corresponding side of the transparent lid 5, the relative positions of the transparent lid 5 and the optical path delimiter 15 are never shifted.

The DSP 7, the solid-state image sensor 1, the optical path delimiter 15 and the like placed one on another on the wiring board 6 are fixed by being sealed in a synthetic resin. A sealing portion 20 made of the synthetic resin is formed substantially in the shape of a rectangular parallelepiped on the wiring board 6 so that part of the optical path delimiter 15 protrudes from the top surface of the sealing portion 20. A plurality of hemispherical connection terminals 9 for performing input and output of signals between the optical device module and digital cameras, camera phones or the like provided with the optical device module are provided in a protruding condition on the lower surface of the wiring board 6. The connection terminals 9 are electrically connected to the conductor wiring 10 formed on the upper surface of the wiring board 6.

In the optical device module having the above-described structure, since the optical path delimiter 15 is disposed so that an end of the lens barrel 17 is in contact with the surface of the transparent lid 5, the distance between the image sensing surface 2 of the solid-state image sensor 1 and the lens 16 is uniquely determined by the sum total of the thickness of the bonding portion 4 and the transparent lid 5 and the distance from the end of the lens barrel 17 to the lens 16. Since the positioning claws 18 of the optical path delimiter 15 abut on the periphery of the transparent lid 5 from four directions to thereby fix the relative positions, the position of the optical path delimiter 15 in the direction of the plane of the transparent lid 5 is uniquely determined. Since the transparent lid 5 is bonded while highly accurately aligned with respect to the image sensing surface 2 of the solid-state image sensor 1, the optical path delimiter 15 can be fixed while highly accurately aligned with respect to the image sensing surface 2 with reference to the transparent lid 5. Since the optical path delimiter 15 is merely in contact with the transparent lid 5 and is not bonded by a bonding agent, there is no influence of nonuniformity in the thickness of the bonding agent.

Since the DSP 7, the solid-state image sensor 1, the optical path delimiter 15 and the like on the wiring board 6 are sealed in a synthetic resin, the optical path delimiter 15 can be fixed to the transparent lid 5 without the use of a bonding agent. Since the DSP 7, the solid-state image sensor 1 and the optical path delimiter 15 are firmly fixed by the synthetic resin, the solid-state image sensor 1, the DSP 7 and the like are never damaged when an external shock is given to the sealing portion 20 or the optical path delimiter 15.

Figure 6A:
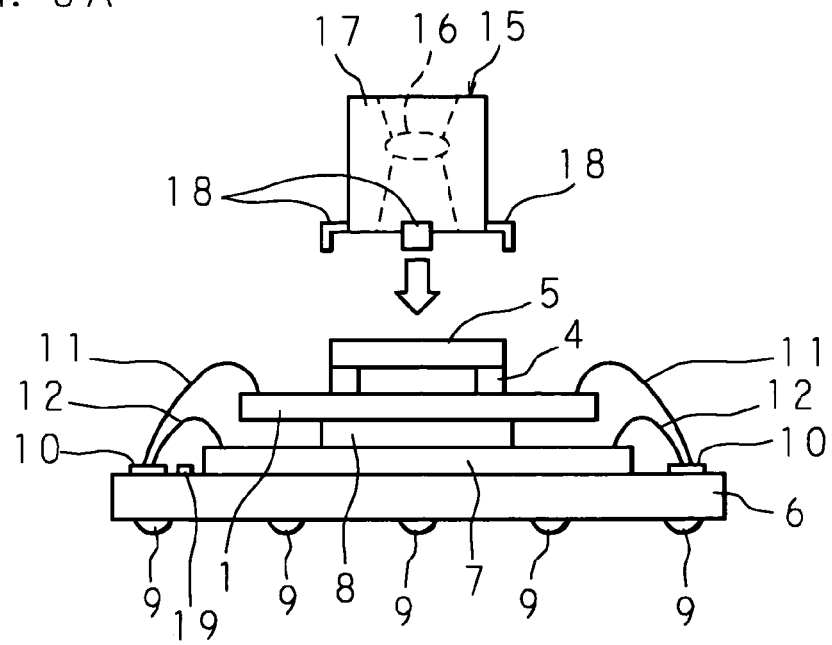
Figure 6B:
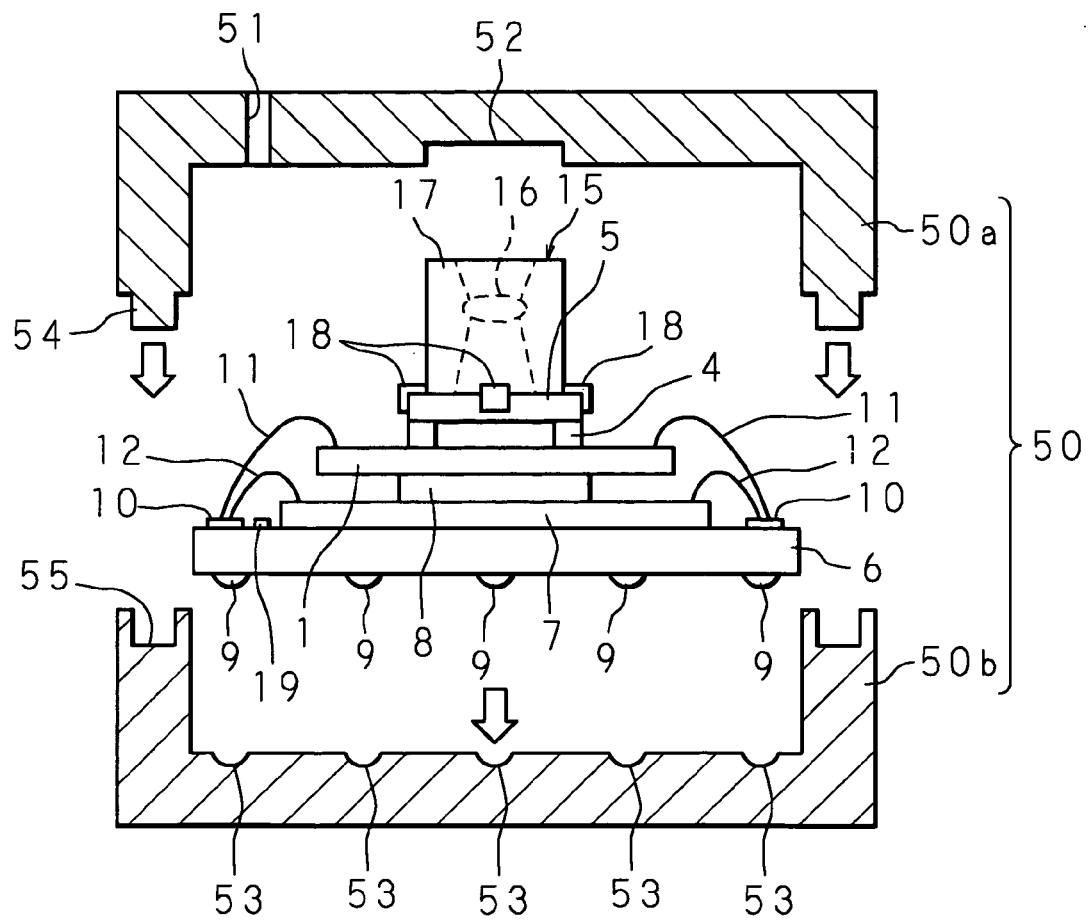

FIGS. 6A to 6C are schematic views showing the fabrication process of the optical device module according to the present invention. FIG. 6A shows a disposition process to dispose the optical path delimiter 15 on the transparent lid 5. The DSP 7, the solid-state image sensor 1 and the like are placed one on another on the wiring board 6, the DSP 7 and the conductor wiring 10 of the wiring board 6 are connected together by the bonding wires 12, and the solid-state image sensor 1 and the conductor wiring 10 are connected together by the bonding wires 11. Then, the optical path delimiter 15 is disposed on the transparent lid 5 bonded to the solid-state image sensor 1. At this time, since the relative positions of the transparent lid 5 and the optical path delimiter 15 are uniquely determined by the positioning claws 18 of the optical path delimiter 15, the optical path delimiter 15 is merely placed on the transparent lid 5.

FIG. 6B show a process to set the DSP 7, the solid-state image sensor 1, the optical path delimiter 15 and the like placed one on another on the wiring board 6, in a mold 50 to be filled with the synthetic resin. The mold 50 substantially has the shape of a rectangular parallelepiped, and is divided into two parts of a lid part 50a and a bottom part 50b substantially at the center of the side periphery. A groove 55 is formed on the upper edge of the bottom part 50b, and a protrusion 54 to be engaged with the groove 55 is formed on the lower edge of the lid part 50a. The mold 50 can be tightly closed by engaging the protrusion 54 and the groove 55 with each other.

An inlet 51 for filling the synthetic resin is formed in an upper part of the lid part 50a. A concave portion 52 for accommodating the upper end of the optical path delimiter 15 is formed on the upper surface of the inside of the lid part 50a. The upper end of the optical path delimiter 15 accommodated in the concave portion 52 protrudes from the upper surface of the sealing portion 20.

The size of the bottom surface inside the bottom part 50b is substantially the same as that of the wiring board 6. A plurality of hemispherical concave portions 53 for accommodating the connection terminals 9 disposed on the lower surface of the wiring board 6 are formed so that the bottom surface inside the bottom part 50b and the lower surface of the wiring board 6 are in close contact with each other. The synthetic resin is prevented from flowing to the lower surface of the wiring board 6 by making the bottom surface inside the bottom part 50b and the lower surface of the wiring board 6 in close contact with each other.

The DSP 7, the solid-state image sensor 1, the optical path delimiter 15 and the like placed one on another on the wiring board 6 are placed in the bottom part 50b of the mold 50, and are covered with the lid part 50a. Then, the protrusion 54 of the lid part 50a and the groove 55 of the bottom part 50b are engaged with each other, thereby tightly closing the mold 50 so that the inside of the mold 50 communicates with the outside only through the inlet 51.

FIG. 6C shows a sealing process to seal the DSP 7, the solid-state image sensor 1, the optical path delimiter 15 and the like in the mold 50 in the synthetic resin. A cylindrical filling pipe 60 is inserted in the inlet 51 of the mold 50, and the synthetic resin is filled into the mold 50 through the filling pipe 60. Then, the synthetic resin cures, so that the optical device module having the appearance shown in FIGS. 3 and 4 is completed.

By the fabrication method having the above-described processes, the optical path delimiter 15 can be fixed to the transparent lid 5 without the use of a bonding agent. Since the DSP 7, the solid-state image sensor 1, the optical path delimiter 15 and the like can be firmly fixed by a synthetic resin, an optical device module tolerant of external shocks can be fabricated. Since the wiring board, the DSP 7, the solid-state image sensor 1, the optical path delimiter 15 and the like are all sealed in a synthetic resin, the fabrication process is easy.

While the optical path delimiter 15 is provided with the positioning claws 18 in the present embodiment, it may be provided with no positioning claw 18. In this case, the position in the direction of the plane of the transparent lid 5 is adjusted in the disposition process. While the solid-state image sensor 1 and the DSP 7 serving as the signal processor are placed one on another as separate semiconductor chips, they may be formed as one semiconductor chip. A semiconductor chip other than the DSP 7 may be placed together with the solid-state image sensor 1. Further, a multiplicity of semiconductor chips may be placed one on another. The shape of the mold for the sealing in a synthetic resin is merely an example, and the present invention is not limited thereto. While the optical path delimiter 15 is not bonded to the transparent lid 5, it may be bonded. In this case, it is desirable to use a sheet-form bonding agent to prevent the occurrence of an error of the thickness of the bonding agent.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. An optical device module comprising:
    a solid-state image sensor having an image sensing surface;
    a transparent lid disposed so as to be opposed to the image sensing surface;
    a bonding portion that directly bonds the transparent lid to the solid-state image sensor, said bonding portion being a sheet-form;
    an optical path delimiter that delimits an optical path to the image sensing surface; and
    fixing means for fixing relative positions of the optical path delimiter and the transparent lid,
    wherein relative positions of the optical path delimiter and the solid-state image sensor are fixed by making the optical path delimiter in contact with the transparent lid.

2. The optical device module according to claim 1, wherein parts, of the optical path delimiter and the transparent lid, that are in contact with each other are not bonded together.

3. The optical device module according to claim 1, wherein the fixing means fixes the solid-state image sensor, the transparent lid and the optical path delimiter by sealing them in a resin.

4. The optical device module according to claim 3, further comprising:
    a wiring board where a conductor wiring is formed; and
    a signal processor and a circuit part fixed to the wiring board and electrically connected to the conductor wiring,
    wherein the fixing means fixes the wiring board, the signal processor and the circuit part by sealing them in the resin together with the solid-state image sensor, the transparent lid and the optical path delimiter.

5. The optical device module according to claim 1, wherein the optical path delimiter has a positioning portion that determines the relative positions of the optical path delimiter and the transparent lid.

6. The optical device module according to claim 5, wherein the transparent lid has a plate form, and
    the positioning portion has a claw that engages with at least two parts of a side surface of the transparent lid when the optical path delimiter is made in contact with one surface of the transparent lid.

7. A method of fabricating an optical device module comprising: a solid-state image sensor having an image sensing surface; a transparent lid disposed so as to be opposed to the image sensing surface; a bonding portion that is a sheet-form and bonds the transparent lid directly to the solid-state image sensor by said sheet-form bonding portion; and an optical path delimiter that delimits an optical path to the image sensing surface, the method comprising:
    a disposition process to dispose the optical path delimiter so as to be in contact with the transparent lid directly bonded to the solid-state image sensor by said sheet-form bonding portion; and
    a sealing process to seal the solid-state image sensor, the transparent lid and the optical path delimiter in a resin.

8. The method of fabricating an optical device module according to claim 7, wherein
    in the sealing process, a wiring board where a conductor wiring is formed and a signal processor fixed to the wiring board and electrically connected to the conductor wiring are further sealed in the resin.

* * * * *